(12) United States Patent
Kumar et al.

(10) Patent No.: US 11,184,008 B2
(45) Date of Patent: *Nov. 23, 2021

(54) DATA RECOVERY TECHNIQUE FOR TIME INTERLEAVED RECEIVER IN PRESENCE OF TRANSMITTER PULSE WIDTH DISTORTION

(71) Applicant: NVIDIA Corp., Santa Clara, CA (US)

(72) Inventors: Gaurawa Kumar, Campbell, CA (US); Ky-Anh Tran, Redwood, CA (US); Olakanmi Oluwole, Mountain View, CA (US); Vishnu Balan, Saratoga, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/943,529

(22) Filed: Jul. 30, 2020

(65) Prior Publication Data

US 2021/0143824 A1 May 13, 2021

Related U.S. Application Data

(63) Continuation of application No. 16/678,979, filed on Nov. 8, 2019, now Pat. No. 10,833,681.

(51) Int. Cl.
| | |
|---|---|
| *H03D 3/24* | (2006.01) |
| *H03L 7/08* | (2006.01) |
| *H04L 25/497* | (2006.01) |
| *H04L 25/49* | (2006.01) |
| *H04L 25/06* | (2006.01) |
| *H04L 25/03* | (2006.01) |

(52) U.S. Cl.
CPC ...... *H03L 7/0807* (2013.01); *H04L 25/03057* (2013.01); *H04L 25/063* (2013.01); *H04L 25/4902* (2013.01); *H04L 25/497* (2013.01); *H04L 2025/03369* (2013.01)

(58) Field of Classification Search
CPC ............. H03L 7/0807; H04L 25/03057; H04L 25/4902; H04L 25/063; H04L 25/497; H04L 2025/03369
USPC ........................................................ 375/376
See application file for complete search history.

(56) References Cited

U.S. PATENT DOCUMENTS

| | | | |
|---|---|---|---|
| 5,018,169 A | 5/1991 | Wong et al. | |
| 5,576,904 A | 11/1996 | Behrens | |
| 5,696,639 A | 12/1997 | Spurbeck et al. | |
| 5,802,118 A | 9/1998 | Bliss et al. | |
| 6,307,906 B1 * | 10/2001 | Tanji ................... | H03D 13/004 375/375 |
| 6,587,529 B1 | 7/2003 | Staszewski et al. | |
| 9,031,182 B2 * | 5/2015 | Valiani ................. | H04L 7/0334 375/376 |
| 9,083,366 B1 * | 7/2015 | Annampedu ......... | H04L 7/0331 |

(Continued)

OTHER PUBLICATIONS

Timing Recovery in Digital Synchronous Data Receivers Kurth. Mueller and Markus Muller May 1976.

*Primary Examiner* — Helene E Tayong
(74) *Attorney, Agent, or Firm* — Rowan TELS LLC

(57) ABSTRACT

This disclosure relates to a receiver that includes a clock and data recovery loop and a phase offset loop. The clock and data recovery loop may be controlled by a sum of gradients for a plurality of data interleaves. The phase offset loop may be controlled by an accumulated differential gradient for each of the data interleaves.

17 Claims, 7 Drawing Sheets

(56) References Cited

U.S. PATENT DOCUMENTS

| | | |
|---|---|---|
| 9,374,217 B1 * | 6/2016 | Forey .................. H03L 7/087 |
| 2010/0141308 A1 | 6/2010 | Villarino-Villa et al. |
| 2012/0194223 A1 | 8/2012 | Singh et al. |
| 2015/0180642 A1 | 6/2015 | Hsieh et al. |

* cited by examiner

DATA RECOVERY TECHNIQUE FOR TIME INTERLEAVED RECEIVER IN PRESENCE OF TRANSMITTER PULSE WIDTH DISTORTION

This application claims priority and benefit as a continuation of U.S. application Ser. No. 16/678,979, filed on Nov. 8, 2019, the contents of which are incorporated herein by reference in their entirety.

FIELD

This disclosure pertains to the field of clock and data recovery by a receiver of data from a transmitter.

BACKGROUND

At the highest level, communication systems include a transmitter (TX), a transmission medium or channel, and a receiver (RX). The transmitter transmits digitally encoded data through the communication channel to the receiver. The receiver samples the channel at particular time instances to properly detect (e.g., slice) the received data without error. Examples of communication channels include memory channels for data storage and retrieval, high speed serial links, deep space satellite communication channels, etc.

A data detector at the receiver recovers data samples from the data signal provided by the transmitter. One example of a data detector is a data slicer. Another example of a data detector is an analog to digital converter (ADC) that generates a multi-bit output from which the data may be detected and from which an estimate of the error in the detected data may also be computed. Another example of a (more complex) data detector is a maximum-likelihood sequence detector (also known as a Viterbi detector). A Viterbi detector is typically used in conjunction with a preceding analog to digital converter stage.

The receiver utilizes clock and data recovery to maintain a desirable data sampling phase. A typical clock and data recovery system includes:

(1) a phase detector to estimate the error in the sampling interval;
(2) a loop filter to correct for noise and jitter; and
(3) a timing adjustment mechanism for the sampling phase.

Examples of timing adjustment elements are phase interpolators, voltage-controlled oscillators (VCOs), phase mixers, or some combination of these elements.

The phase detector may also be referred to as a gradient calculator and is typically deployed to drive the clock and data recovery control loop. The phase detector may be an oversampled phase detector such a bang-bang or Alexander phase detector, or a baud rate phase detector. An oversampled phase detector uses additional sampled data to supplement the main clock and data recovery sampled data. For example, a typical bang-bang phase detector uses data sampled at 0.5 unit intervals offset from the data obtained from the clock and data recovery. In contrast a baud rate phase detector uses only the data obtained from the clock and data recovery.

The ongoing demand for higher data rates in wireline communication has led to transceiver solutions which rely on multiple parallel signal paths (interleaves) to reduce the bandwidth and complexity of each interleave while increasing the overall throughput. Maintaining phase alignment of the clocks driving these interleaves on both receiver and transmitter, while also adapting to errors arising in the transmitter (e.g., pulse width distortion), becomes crucial to accurate data recovery.

BRIEF SUMMARY

This disclosure relates to a receiver comprising a clock and data recovery loop and a phase offset loop. The clock and data recovery loop may be controlled by a sum of gradients for a plurality of data interleaves. The phase offset loop may be controlled by an accumulated differential gradient for each of the data interleaves.

This disclosure further relates to a clock and data recovery circuit comprising a phase detector, a multiphase clock, and a plurality of configurable delay elements. The phase detector may be configured to determine a sum of gradients for a plurality of data signals. The phase detector may further be configured to determine an accumulated differential gradient for each of the data signals. The multiphase clock generator may be coupled to receive the sum of gradients from the phase detector. The plurality of configurable delay elements may each be configured to receive one of the accumulated differential gradients.

This disclosure relates to a clock and data recovery circuit comprising a plurality of sample and hold elements, a phase detector, and a multiphase clock generator. The sample and hold elements may be controlled by delay circuits. The phase detector may be configured to output a plurality of accumulated differential gradients for data signals from the sample and hold elements to control the delay circuits. The multiphase clock generator may supply clock signals to the delay circuits, as controlled by a sum of gradients for the data signals.

Finally, this disclosure relates to a method for controlling a data slicer. The method first comprises sampling each of a plurality of data signals at a different time by applying a delayed multiphase clock signal to each of the data signals via a different delay circuit. The method further comprises configuring each of the different delay circuits with an accumulated differential gradient for a different one of the data signals. Next, the method comprises supplying each of the different delay circuits with a different one of a plurality of outputs of a multiphase clock. The method finally comprises controlling the multiphase clock with a sum of gradients of the data signals.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
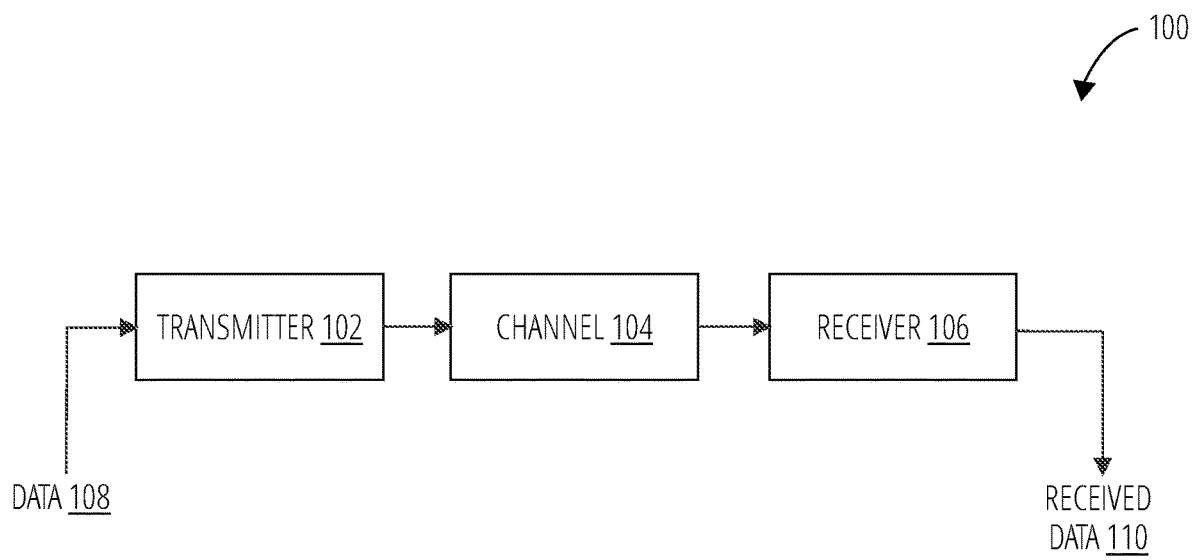
FIG. 1 depicts a communication system 100 in accordance with one embodiment.

Herein various terms are used that should be accorded the following interpretation. Other terms should be accorded their ordinary meaning in the art as would be understood in the context they are used.

"Data signal" refers to a sequence of data samples. "Data sample" refers to a discrete unit of information (e.g., a bit) conveyed in a data signal. "Data interleave" refers to a data signal path having a particular time base that distinguishes it from other data signals for purposes of data slicing. "Data slicer" refers to logic that identifies boundaries in a data signal representing data samples.

"Differential gradient" refers to a difference between the gradient of a data interleave and an average gradient for all the data interleaves. "Accumulated differential gradient" refers to a value of a differential gradient accumulated over time. "Sum of gradients" refers to an accumulation of gradient values over time. In a control loop environment the gradient will tend to switch between positive and negative values, so that the sum of gradients over time will remain stable.

"Configurable delay element" refers to a delay element for which the delay introduced between its inputs and outputs can be configured (changed) during operation via one or more control terminals. "Delay element" refers to logic to introduce a delay in the propagation of a signal between components in a circuit. A delay element implemented in hardware is referred to herein as a 'delay circuit', "Sample and hold element" refers to logic to temporarily capture and store a time interval of a data signal. "Phase detector" refers to logic to detect the relative phase of a clock signal.

"Multiphase clock" refers to a composite clock signal comprising multiple discrete clock signals each having a different relative phase. "Clock and data recovery" refers to the process of synchronizing the clock(s) of a receiver with the clock used by a transmitter to generate a data signal(s), and the recovery of data samples from the data signal(s) by the receiver.

"Clock and data recovery loop" refers to a control loop implemented on a multiphase clock in a receiver to align the receiver clock with a transmitter clock, to more accurately extract data samples from the transmitter data signal. "Phase offset loop" refers to a control loop to adjust the delay of applying clock signals from a multiphase clock to a data sampling circuit to account for variations in the phase of a clock signal by adapting a sampling point in the data signal.

Mechanisms are disclosed herein for clock and data recovery by receivers on high-speed data links. These mechanisms may be implemented on various types communication channels including serial links between processors (e.g., general purpose processors such as central processing units and graphics processing units) and memory channels such as those used with the aforementioned processors and those used for hard disks and flash solid state drives.

The disclosed clock and data recovery mechanisms may be implemented as all-digital solutions and thus readily implemented with minor changes to conventional components, such as register transfer level (RTL) code. There is no reliance on the presence of a preamble sequence in the transmitted data. Both the error detector and the injection mechanism may be implemented digitally. This enables programmable configuration and control in particular implementations.

Even when clock phases are generated from an oscillator there may exist systematic and random mismatches between the transmitter and the receiver that cause clock phase misalignment and lead to data sampling errors. Conventional solutions to address such phase misalignment requires generation of a clean clock source to align each phase to the clean clock. Even though phase alignment is done correctly, any impairments arising in the transmitter are not compensated for, which reduce margins.

Let y(n) represent received data samples. These samples may include errors arising from, for example, inter-symbol interference, noise, cross talk, pulse width distortion, etc. The decision estimates of the error in the samples y(n) may be denoted by $\hat{y}(n)$. Let e(n) be the difference or error. Then:

$$e(n)=y(n)-\hat{y}(n)$$

An exemplary timing gradient $\Delta(n)$ is the Mueller and Muller timing gradient as given by:

$$\Delta(n)=y(n)\hat{y}(n-1)-y(n-1)\hat{y}(n)$$

This gradient may also be written as:

$$\Delta(n)=e(n)\hat{y}(n-1)-e(n-1)\hat{y}(n)$$

Another exemplary timing gradient that may be utilized is the minimum mean squared (MMSE) derived gradient:

$$\Delta(n)=e(n)[\hat{y}(n+1)-\hat{y}(n-1)]$$

which is non-causal due to utilizing a future estimate. This gradient may be written equivalently in its causal form making use of only current or past values as:

$$\Delta(n)-e(n-1)[\hat{y}(n)-\hat{y}(n-2)]$$

These equations may characterize the output of a phase detector and may drive a clock and data recovery loop. An accumulated version of the gradient may also be utilized to drive the clock and data recovery loop. For example if the gradient is accumulated over L symbols:

$$\Delta_L(n)=\Sigma_0^{L-1}\Delta(n) \qquad \text{Equation 1}$$

Equation 1

FIG. 1 illustrates a communication system 100 according to some embodiments. The communication system 100 includes a transmitter 102 to transmit data, a receiver 106 to receive the data, and a communication channel 104, e.g., a medium, through which the data is transmitted from the transmitter 102 to the receiver 106. In general, the basic purpose of a communication system 100 is to transmit data from a source, e.g., the transmitter 102, to a destination, e.g., the receiver 106.

The transmitter 102 encodes the data into a form suitable for transmission over the communication channel 104. The transmitted data 108 arrives at the receiver 106 as received data 110, i.e. the data signal. The receiver 106 processes the received data 110 such that the received data 110 and the transmitted data 108 are identical.

Figure 2:
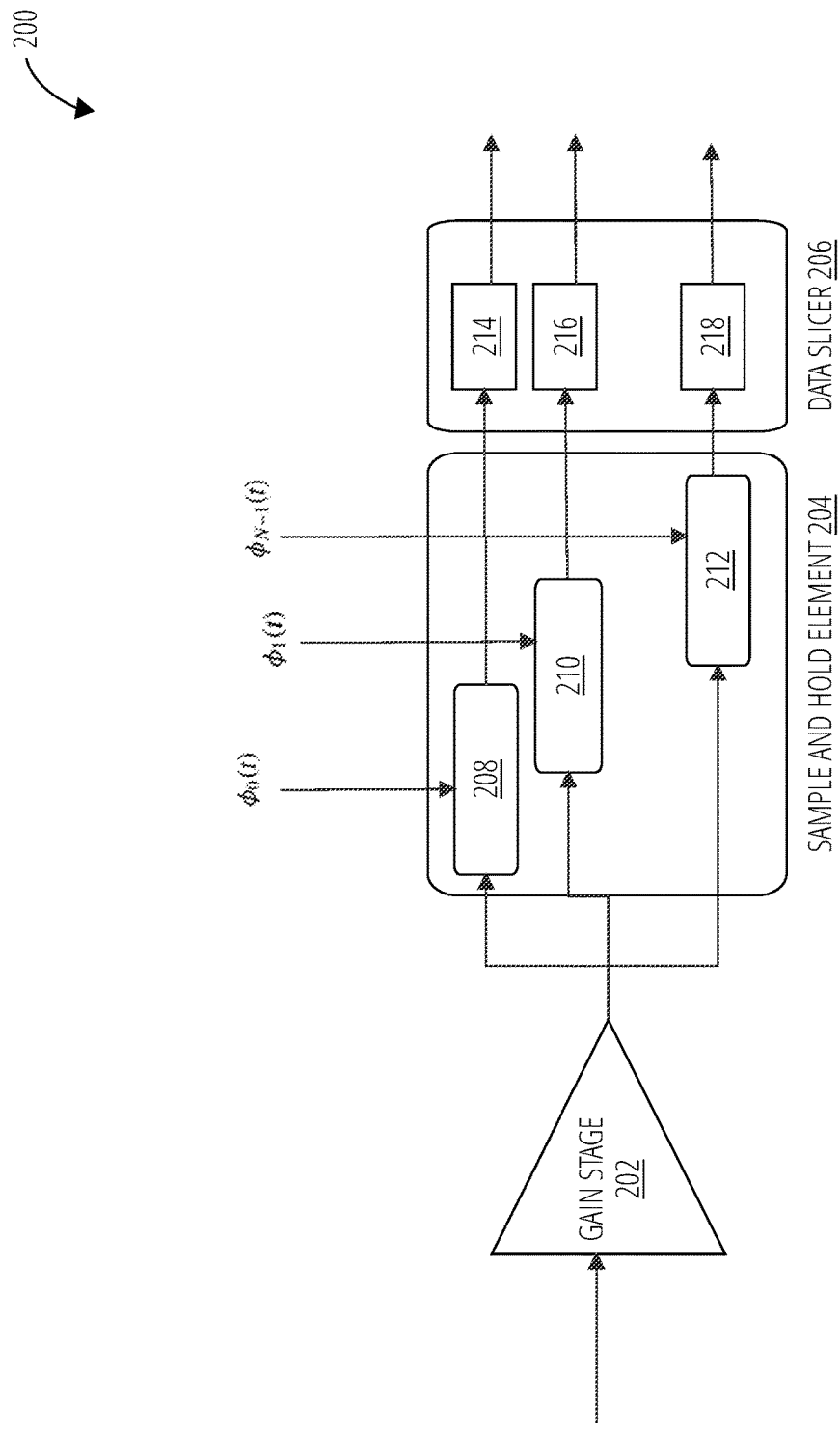
FIG. 2 depicts an exemplary receiver front end 200 with interleaved sampling.

FIG. 2 depicts an exemplary receiver front end 200. The receiver front end 200 comprises a gain stage 202 and a sample and hold element 204 comprising a number of switched sampling circuits (switched sampling circuit 208, switched sampling circuit 210, and switched sampling circuit 212). The receiver front end 200 also comprises a data slicer 206 comprising a number of slicing circuits (slicing circuit 214, slicing circuit 216, and slicing circuit 218).

For a time interleaved receiver with N sampling phases as depicted in FIG. 2, each interleave interval i, $0 \leq i \leq N$, samples the data and error at its sampling time $\tau_i$. Timing gradient for each interleave $\Delta Ki$ can thus be calculated using the data and error sample from the current interleave and the interleave sampling the data one symbol period earlier at time $\tau_{(i-1) \bmod N}$. The gradient for the ith interleave can now be written as $$\Delta Ki = e_i * d_{(i-1) \bmod N} - e_{(i-1) \bmod N} * d_i$$

This holds true if all sampling times satisfy the condition $$\tau_i - \tau_{(i-1) \bmod N} = T_b$$

where Tb is the symbol period defined by Tb=1/baudrate.

Consider a half-rate TX where the data is launched on both edges of the clock and clock has duty cycle error=$\alpha$. This results in pulse width distortion (PWD) and the pulse widths for alternating data bits transmitted are not $T_b$ but $(1-\alpha)T_b$ and $(1+\alpha)T_b$. Adding channel ISI to this consideration and confining the analysis to first pre and post cursors, the signal at receiving end becomes asymmetrically distorted and has different pre and post contributions from the bits around it. Excluding any transmitter PWD the incoming signal $x_n$ at receiver can be written as $$x_n = a_n * h_o + a_{n-1} * h_1 + a_{n+1} * h_{-1}$$

where an denotes the transmitted data symbol and $h_r$ is the channel transfer function. With transmitter PWD factored in the incoming signal alternates between two values $a_n(0)$ and $a_n(1)$ defined as $$a_n(0) = a_n * h_0 + a_{n-1} * h_{1+\alpha} + a_{n+1} * h_{-1+\alpha}$$

$$a_n(1) = a_n * h_0 + a_{n-1} * h_{1+\alpha} + a_{n+1} * h_{-1-\alpha}$$

The received signal expresses more non-ideal terms as more pre and post cursors from the channel are included. If the transmitter is quarter rate using four different clock edges then the received signal is distorted by mismatches from all four clock edges. Conventional receiver phase alignment techniques that analyze the clock sampling phases independent of the received data fail to compensate for transmitter PWD.

Figure 3:
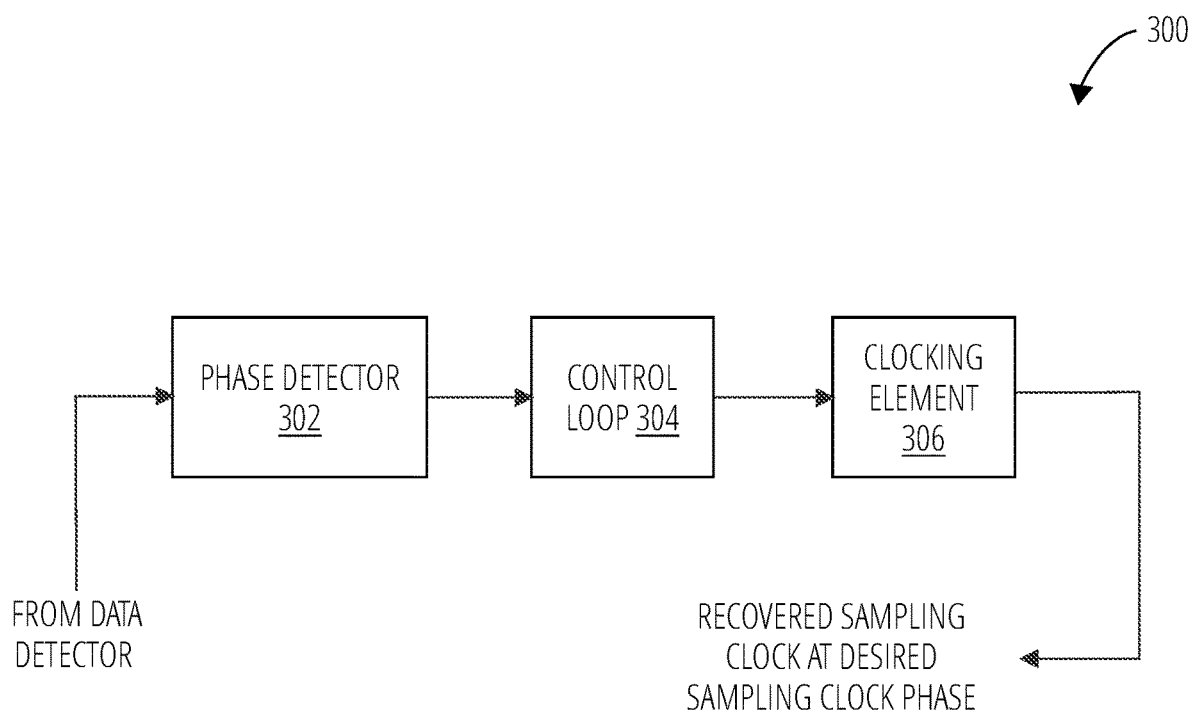
FIG. 3 depicts an exemplary clock and data recovery system 300.

FIG. 3 illustrates a clock and data recovery system 300 in accordance with one embodiment. In some embodiments, the clock and data recovery system 300 includes a phase detector 302, a control loop 304 and a clocking element 306. The data detector output may be used to calculate a timing adjustments for the clocking element 306.

Figure 4:
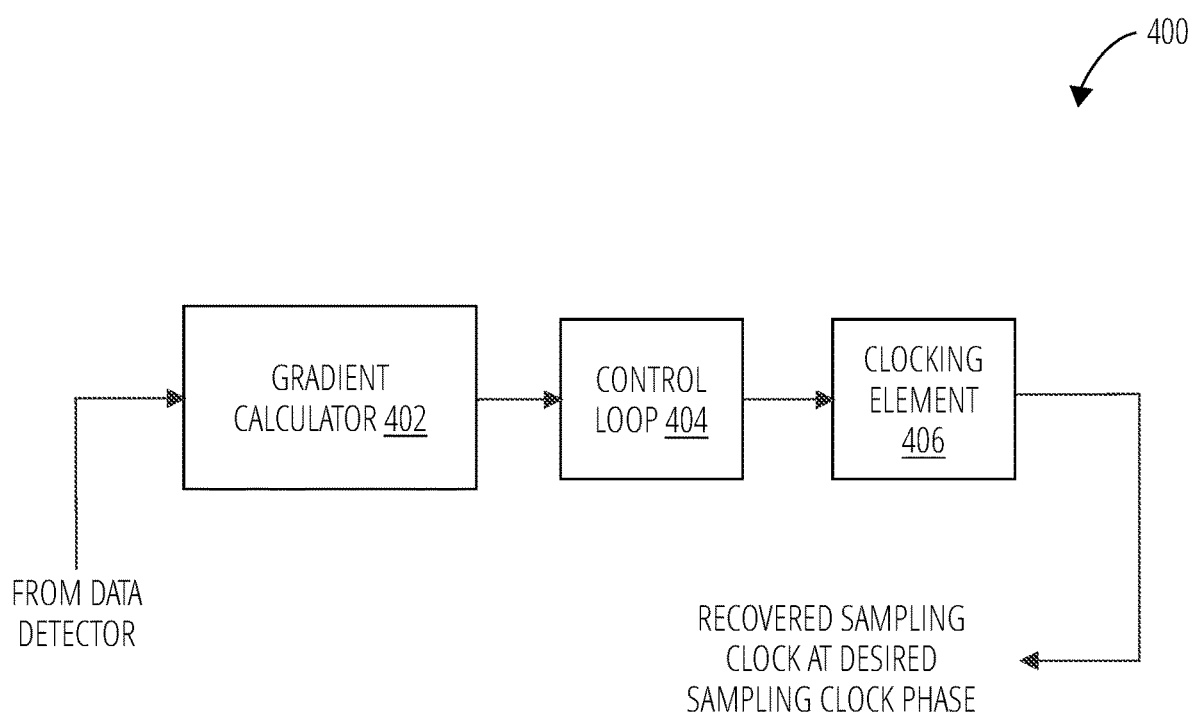
FIG. 4 illustrates a clock and data recovery system 400 in accordance with another embodiment.

FIG. 4 illustrates a clock and data recovery system 400 in accordance with another embodiment. The clock and data recovery system 400 includes a gradient calculator 402, a control loop 404, and a clocking element 406. An exemplary timing gradient $\Delta(n)$ that may be determined by the gradient calculator 402 is the Mueller and Muller timing gradient or one of the MMSE variants. In some systems an accumulated version of the gradient may be utilized to drive the control loop 404, for example if the gradient is accumulated over L symbols according to Equation 1.

Figure 5:
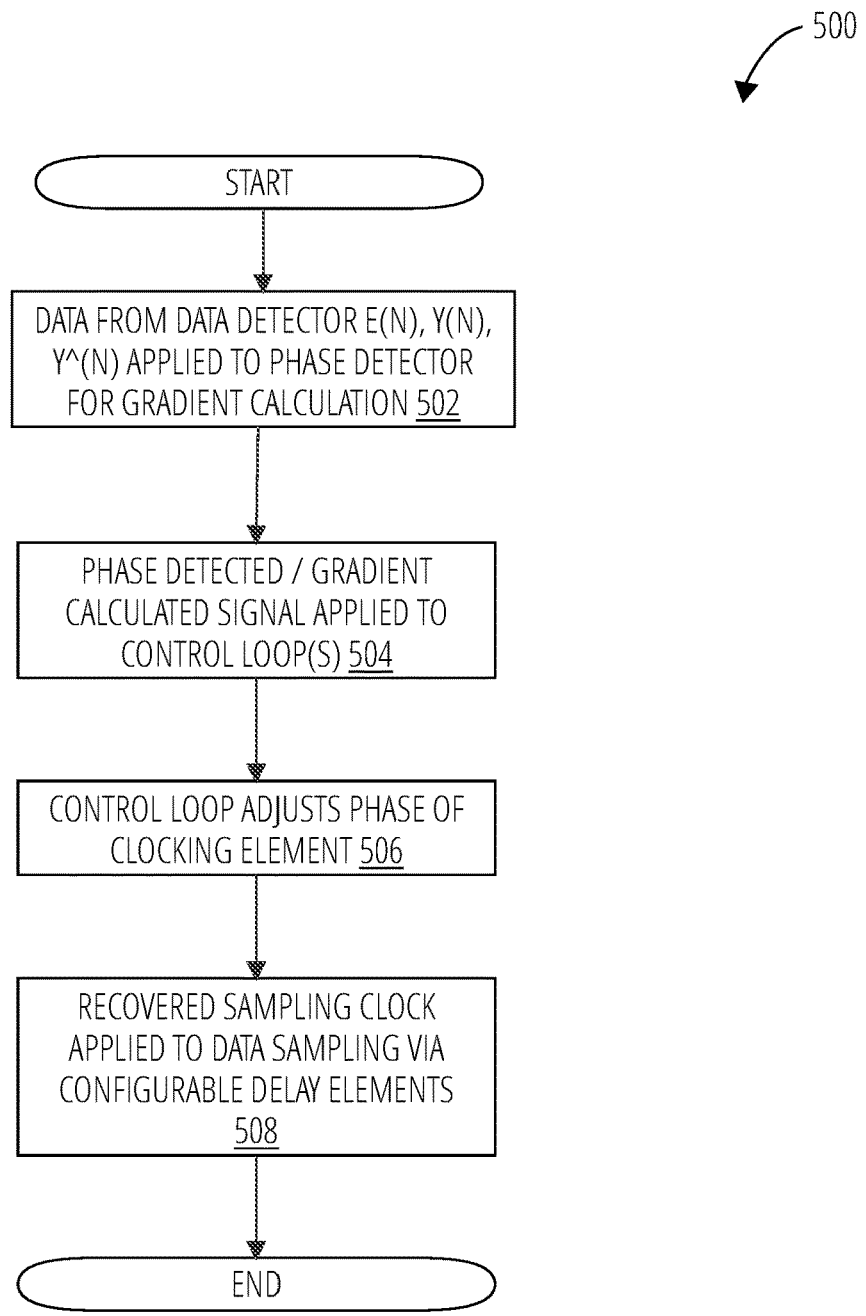
FIG. 5 illustrates a clock and data recovery process 500 in accordance with one embodiment.

FIG. 5 illustrates a clock and data recovery process 500 in accordance with one embodiment. In some embodiments, the clock and data recovery process 500 includes sending data and sampling errors (e(n), y(n), y^(n)) to the phase detector for gradient calculation, as shown at block 502. As represented by block 504, an accumulated gradient and/or sum of gradients is applied to a control loop. The control loop adjusts the phase of a clocking element, as shown at block 506. In some embodiments, the adjusted sampling clock at a desired sampling clock phase is further adjusted via configurable delay elements, as represented by block 508.

The disclosed clock and data recovery mechanisms align the sampling phases for multiple data interleaves and adapt them to an optimal sampling time to construct an improved sampling eye on each interleave for a received data signal distorted by transmitter pulse width distortion (PWD) and channel inter-symbol interference (ISI), for example.

Figure 6:
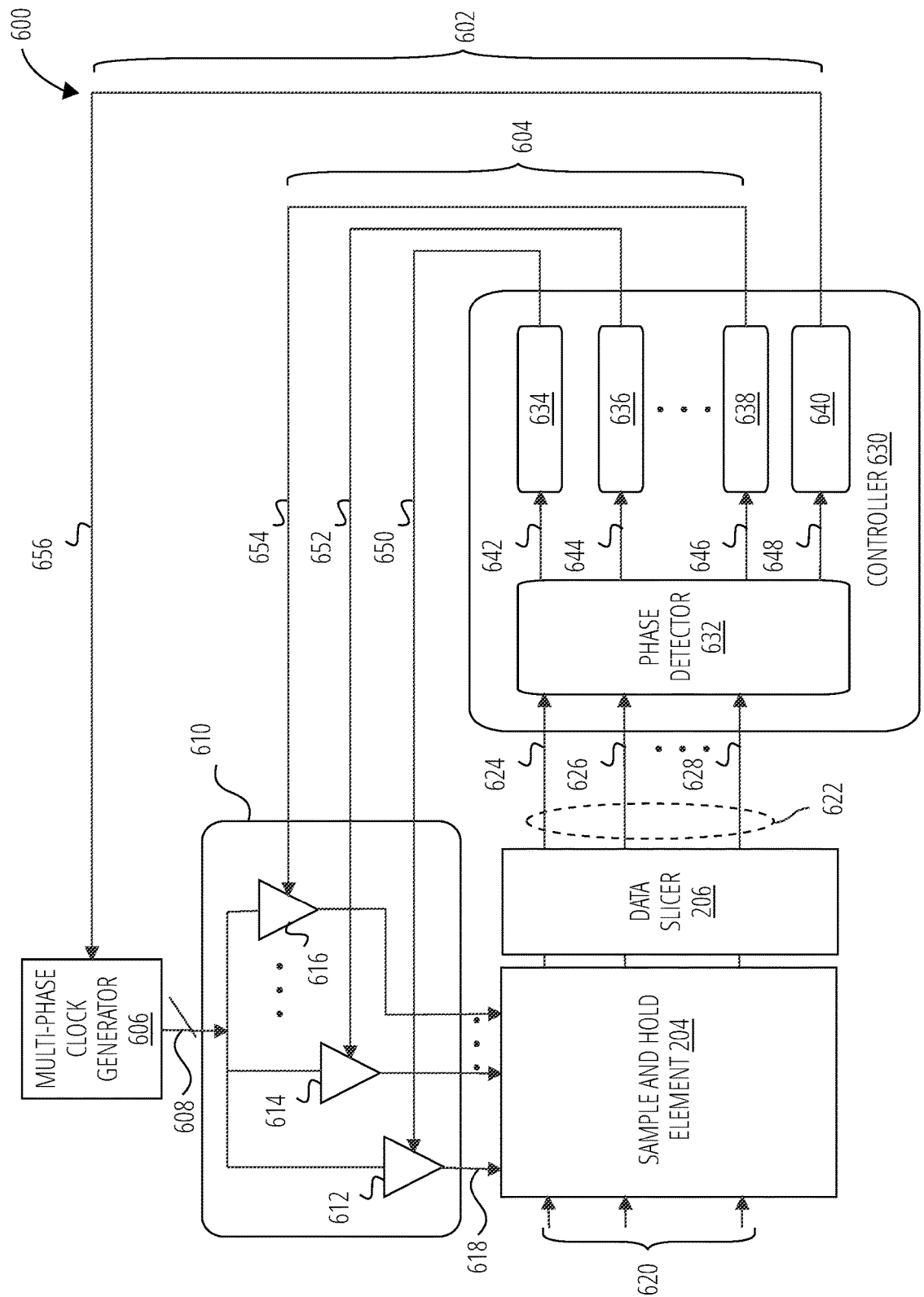
FIG. 6 depicts a time interleaved sampling receiver 600 utilizing a phase correction loop in accordance with one embodiment.

In the receiver 600 depicted in FIG. 6 the data sample and sample error from each data interleave are sampled output to a phase detector that generates a cumulative instantaneous gradient $\Delta K$ and differential gradients $\Delta Ki$ for each individual interleave. "Sample error" refers to a difference metric between where a data sample is located in a data signal, and the region of the data signal that is sampled. The clock and data recovery (CDR) loop is influenced by the cumulative instantaneous gradient and locks such that $\Delta K$ is minimized. The cumulative instantaneous gradient is a sum of the individual instantaneous gradients of the interleaves. The individual interleave differential gradients are applied to control configurable delays on the multiphase clock paths that determine the sampling window for the data samples on each interleave.

At a high level, the receiver 600 may comprise a clock and data recovery loop 602 and a phase offset loop 604 configured to implement the circuitry and methods disclosed herein. The clock and data recovery loop 602 and phase offset loop 604 may comprise a multi-phase clock generator 606, configurable delays 610, sample and hold element 204, and a controller 630. Multi-phase clock generator 606 may be coupled to the configurable delays 610 such that it delivers multiphase clock signals having N clock phases 608 to the configurable delays 610. The configurable delays 610 may produce N delayed clock signals 618 from the multiphase clock signals having N clock phases 608. The configurable delays 610 may be coupled to the sample and hold element 204 to deliver these delayed clock signals 618 to the sample and hold element 204.

The sample and hold element 204 may be further coupled to N data signals over data channels 620. Each data channel may be acted upon by one of the sample and hold element 204 based on the delayed clock signals 618, such that the sample and hold element 204 produce instantaneous data samples and sample errors over data interleaves 622 wherein there is one data interleave for each of the data signals or data channels. "Data channel" refers to the data signal on a data interleave. The sample and hold element 204 may be coupled to the controller 630 such that the controller 630 receives the instantaneous data samples and sample errors over data interleaves 622.

From the instantaneous data samples and sample errors over data interleaves 622, the controller 630 may be configured to produce an accumulated differential gradient for each data interleave as described in further detail below. For an embodiment having N data interleaves, the controller 630 may produce an accumulated differential gradient for interleave 0 650, an accumulated differential gradient for interleave 1 652, and additional accumulated differential gradients through accumulated differential gradient for interleave N−1 654. The controller 630 may be coupled to the configurable delays 610 such that the accumulated differential gradient for interleave 0 650 through accumulated differential gradient for interleave N−1 654 become the control signals used to delay the multiphase clock signals. The control feedback of the accumulated differential gradients may comprise the phase offset loop 604 disclosed herein.

From the instantaneous data samples and sample errors over data interleaves 622, the controller 630 may also be configured as described below to generate a sum of instantaneous interleave gradients 656. The controller 630 may be coupled to the multi-phase clock generator 606 such that the sum of instantaneous interleave gradients 656 is provided to the multi-phase clock generator 606 as a control signal. The control feedback of the sum of instantaneous interleave gradients 656 may comprise the clock and data recovery loop 602 disclosed herein.

The configurable delays 610 may comprise a delay element for each clock phase signal generated by the multi-phase clock generator 606. "Clock phase" refers to the relative phase of a clock signal in relation to other clock signals. In one embodiment, these delay elements may comprise delay element 0 612, delay element 1 614, and additional delay elements through delay element N−1 616. The delay elements are coupled to the multiphase clock signals having N clock phases 608 and the accumulated differential gradient for interleave 0 650 through accumulated differential gradient for interleave N−1 654 such that the accumulated differential gradients act as discrete control signals that may allow each output from the multiphase clock to be selectively delayed, generating the delayed clock signals 618. The delay elements may be individual configurable delay elements, software-controlled delays, or some other element that may selectively delay a clock signal based on a control signal.

Sample and hold element 204 may comprise a set of discrete circuits or modules which accept as input the plurality of data signals over data channels 620. The delayed clock signals 618 may be used to control the phase and timing of a sampling function that may be configured to generate instantaneous data samples and sample errors over data interleaves 622. The instantaneous data samples and sample errors over data interleaves 622 may comprise a data sample and sample error for interleave 0 624, a data sample and sample error for interleave 1 626, and additional data samples and sample errors through data sample and sample error for interleave N−1 628. Data sample and sample error for interleave 0 624 through data sample and sample error for interleave N−1 628 may be coupled to the controller 630.

The controller 630 may comprise a phase detector 632, an accumulator 0 634, an accumulator 1 636, additional accumulators through accumulator N−1 638, and a clock and data recovery circuit 640. The phase detector 632 of the controller 630 may be coupled to the data sample and sample error for interleave 0 624 through data sample and sample error for interleave N−1 628. From the data samples and sample errors for each of the data interleaves, the phase detector 632 may generate a differential gradient D(K0) 642, a differential gradient D(K1) 644, and additional differential gradients through differential gradient D(K[N−1]) 646. The phase detector 632 may also use the data samples and sample errors to generate a sum of gradients ΔK 648. The accumulator 0 634 may be coupled to the differential gradient D(K0) 642, the accumulator 1 636 to the differential gradient D(K1) 644, and so on through the accumulator N−1 638 coupled to the differential gradient D(K[N−1]) 646. In this manner, the accumulator 0 634 through accumulator N−1 638 may be configured to generate the accumulated differential gradient for interleave 0 650 through accumulated differential gradient for interleave N−1 654 that couple the controller 630 to the configurable delays 610 for the purpose of creating the phase offset loop 604. Further, the clock and data recovery circuit 640 may be coupled to the sum of gradients ΔK 648 to generate the sum of instantaneous interleave gradients 656 that couples the controller 630 to the multi-phase clock generator 606 to form the clock and data recovery loop 602.

Figure 7:
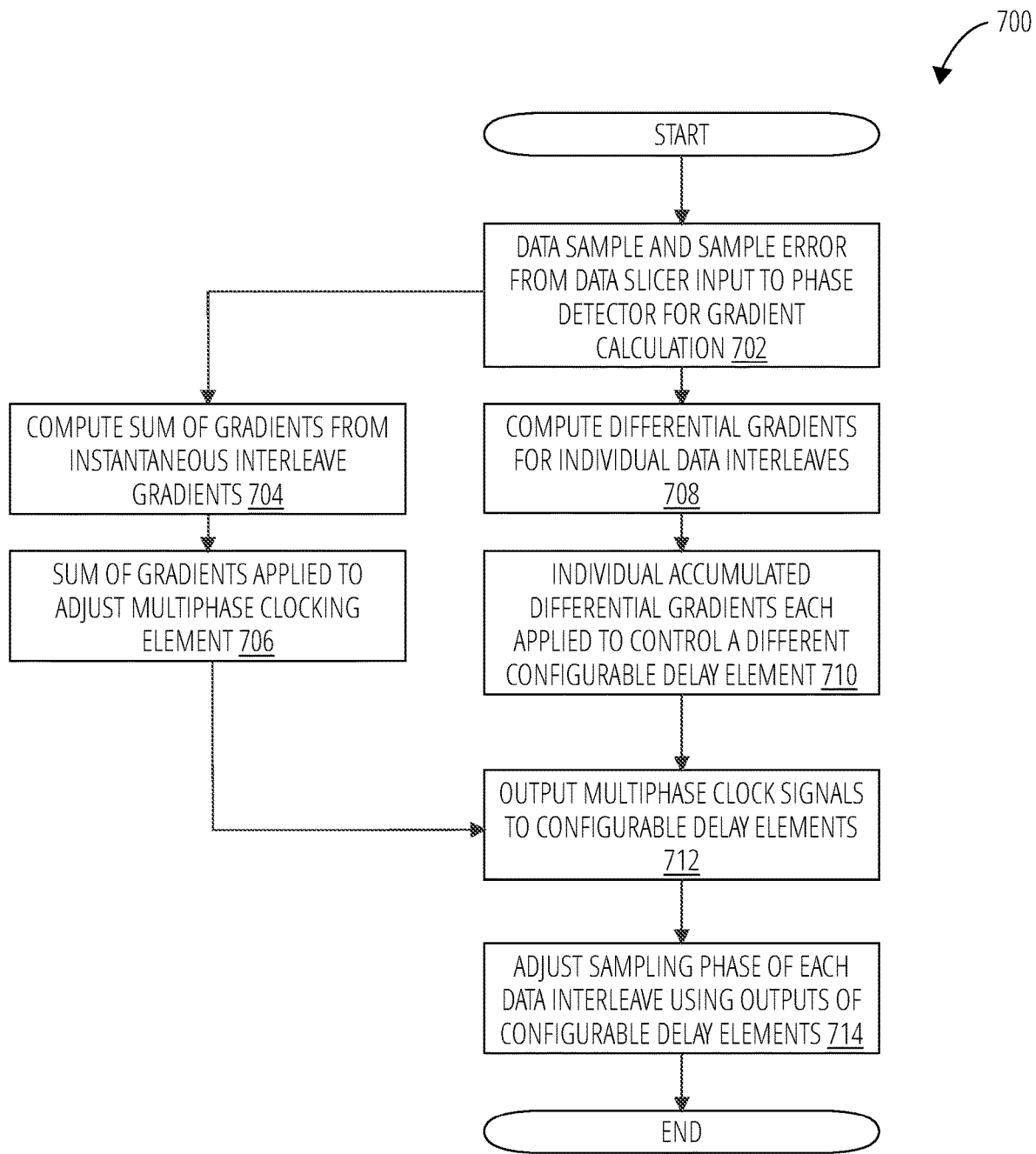
FIG. 7 depicts a clock and data recovery process 700 in accordance with one embodiment.

FIG. 6 may in one embodiment operate according to the processes depicted in FIG. 7. In a first scenario the transmitter and receiver clocks have zero frequency offset from one another. In scenario ΔK converges to zero. In a second scenario the transmitter and receiver clocks have a fixed (non-varying) frequency offset from one another. In this scenario the CDR locks ΔK to a non-zero constant value. In a third scenario the transmitter and receiver clocks have a time-variable frequency offset (SSC) from one another. In this scenario the gradient is time varying and periodic with a period equal to the SSC frequency.

Because ΔK is non zero in most applications, to find the optimal placement of each phase a differential gradient $D_{ki}$ is created for each interleave. $D_{ki}$ is defined as follows.

$$D_{ki} = \Delta K_i - K/N$$

$K_{ki}$ is the error or deviation of each interleave's gradient from the average cumulative gradient. The sum of these differentials is zero by definition. The CDR loop locks based on ΔK while each differential gradient $D_{ki}$ is accumulated and controls a digitally controlled delay element per the respective phase. This delay control path is referred to herein as a phase offset loop. The two loops work together forming a common phase alignment loop and differential phase correction loop. The gain and bandwidth of each loop is controlled so that the loops do not interact with each other. The phase correction loop may be implemented with built-in hysteresis to reduce dithering in a digital domain implementation.

With an ideal transmitter with no PWD each $D_{ki}$ will be zero on average if all receiver phases are equally spaced. In the presence of mismatches between the phases $D_{ki}$ is non-zero and the phase correction loop will converge to zero. This is true for all three scenarios above.

FIG. 7 depicts a clock and data recovery process 700 in one embodiment. The clock and data recovery process 700 may be used to adjust the sampling phase of each data interleave using configurable delay circuit outputs. The actions depicted should not be presumed to necessarily occur in the order presented, unless an action depends on the result of a previous action to be carried out. If two or more actions are not conditioned on one another in some way, one skilled in the art will readily ascertain that they may be carried out in parallel, in a time-division fashion, or in a different order.

At block 702, a data sample and sample error may be sent from a data slicer to a phase detector for gradient calculation. This action may be carried out for example upon the outputs from the sample and hold element 204 first introduced in FIG. 6. This action may result in the data sample and sample error for interleave 0 624 through data sample and sample error for interleave N−1 628 signals sent to the phase detector 632 for gradient calculation.

At block 704, a sum of gradients may be computed from instantaneous data interleave gradients. This may be carried out for example by the phase detector 632 of the controller 630 introduced in FIG. 6. This may result in a sum of gradients ΔK 648 that may be input to a clock and data recovery circuit 640 to produce a sum of instantaneous interleave gradients 656.

At block 706, the sum of gradients may be applied to adjust a multiphase clocking element. This action may be carried out for example by the sum of instantaneous interleave gradients 656 that is generated by the clock and data recovery circuit 640 of the controller 630. The sum of instantaneous interleave gradients 656 may be coupled to the multi-phase clock generator 606 introduced in FIG. 6 to act upon the multiphase clock output of the multi-phase clock generator 606 to form the clock and data recovery loop 602.

At block 708, the differential gradients for individual data interleaves are computed. This may be carried out for example by the phase detector 632 introduced in FIG. 6. The phase detector 632 may as a result send the differential gradient D(K0) 642 through differential gradient D(K[N−1]) 646 to accumulator 0 634 through accumulator N−1 638, respectively. The accumulators in FIG. 6 may from these differential gradients generate the accumulated differential gradient for interleave 0 650 through accumulated differential gradient for interleave N−1 654.

At block 710, the individual accumulated differential gradients are each applied to control a different configurable delay element. This may be carried out by the accumulated differential gradient for interleave 0 650 through accumulated differential gradient for interleave N−1 654 coupled to the delay element 0 612 through delay element N−1 616, as introduced in FIG. 6. These signals coupled from the controller 630 to the configurable delays 610 may form the phase offset loop 604.

At block 712, the multiphase clock signals are output to the configurable delay circuits. This may be carried out by the multi-phase clock generator 606 introduced in FIG. 6. The multi-phase clock generator 606 may provide multi-phase clock signals having N clock phases 608 to the configurable delays 610. As a result, the configurable delays 610 may generate delayed clock signals 618, which may be coupled to the sample and hold element 204.

In block 714, the sampling phase of each data interleave may be adjusted using the outputs of the configurable delay elements, i.e., the delayed clock signals 618 introduced in FIG. 6. The adjustment of the sampling phase may result into a new set of data samples and data errors for each interleave, which may allow the receiver 600 implementing this clock and data recovery process 700 to self-correct for phase misalignment to improve signaling performance.

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A receiver comprising:
   a clock controlled by a sum of gradients for a plurality of data interleaves; and
   a data sampling loop controlled by the clock and an accumulated differential gradient for each of the plurality of data interleaves.

2. The receiver of claim 1, further comprising:
   a sample and hold element for each of the data interleaves.

3. The receiver of claim 2, wherein each of the sample and hold elements configured to output a data sample and a sample error for each of the data interleaves to a phase detector.

4. The receiver of claim 3, wherein the phase detector configured to determine the accumulated differential gradient for each of the data interleaves and to determine the sum of gradients for the data interleaves.

5. The receiver of claim 2, wherein each of the sample and hold elements configured to be controlled by a signal influenced by both of the clock and data recovery loop and the phase offset loop.

6. The receiver of claim 2, wherein each of the sample and hold elements controlled by a configurable delay element.

7. The receiver of claim 6, wherein each of the configurable delay elements coupled to receive a different clock phase from a multiphase clock generator.

8. The receiver of claim 1, wherein the data sampling loop further comprises:
 a plurality of configurable delay elements each to receive the accumulated differential gradient for a corresponding one the plurality of data interleaves.

9. A method comprising:
 computing a sum of gradients for a plurality of data interleaves;
 applying the sum of gradients to control a phase of a clock;
 applying an output of the clock to an adjustable delay element;
 adjusting a delay of the delay element with an accumulated differential gradient for a data interleave; and
 applying an output of the delay element to sample data on the data interleave.

10. The method of claim 9, further comprising:
 applying an output of the delay element to a sample and hold element for the data interleave to generate a data sample.

11. The method of claim 10, further comprising:
 applying the data sample and a sample error for the data interleave to a phase detector.

12. The method of claim 11, further comprising:
 configuring the phase detector to determine the accumulated differential gradient for the data interleave and to determine the sum of gradients for the plurality of data interleaves.

13. The method of claim 9, wherein the clock is a multiphase clock.

14. A receiver comprising:
 a multi-phase clock circuit;
 a plurality of configurable delay circuits each receiving a different output of the multi-phase clock circuit;
 the multi-phase clock controlled by a sum of gradients for a plurality of data interleaves; and
 the configurable delay circuits each controlled by an accumulated differential gradient for a different one of the plurality of data interleaves.

15. The receiver of claim 14, further comprising a phase detector circuit.

16. The receiver of claim 15, wherein the phase detector circuit is configured to determine the accumulated differential gradient for each of the data interleaves and to determine the sum of gradients for the data interleaves.

17. The receiver of claim 14, further comprising a plurality of sample and hold circuits each controlled by a corresponding one of the configurable delay circuits.

* * * * *